MULTISTAGE AMPLIFIER WHICH PREVENTS SELF-OSCILLATIONS

Filed March 11, 1968

2 Sheets-Sheet 1

Inventor:
Hans Kubach

Inventor:
Hans Kubach

United States Patent Office 3,512,102

Patented May 12, 1970

3,512,102

MULTISTAGE AMPLIFIER WHICH PREVENTS SELF-OSCILLATIONS

Hans Kubach, Vierhheim, Germany, assignor to Brown, Boveri & Cie Aktiengesellschaft,, Mannheim-Kafertal, Germany, a corporation of Germany Filed Mar. 11, 1968, Ser. No. 711,945

Claims priority, application Germany, Mar. 9, 1967, B 91,534

Int. Cl. H03f *1/34*

U.S. Cl. 330—107 2 Claims

ABSTRACT OF THE DISCLOSURE

Each of a plurality of amplifier stages of a multistage amplifier has a frequency-dependent feedback circuit connected between its output and its input. The components of each feedback circuit have magnitudes such that the resultant amplification v. frequency response characteristic includes a continuously extending integral portion approximating that of the amplifier without feedback, and self-oscillations of the amplifier are prevented. The feedback circuit of each of the amplifier stages comprises a capacitor and a first resistor connected in series circuit between the output and the input of the corresponding amplifier stage and a second resistor connected in parallel with the series circuit connection.

DESCRIPTION OF THE INVENTION

Figure 1:
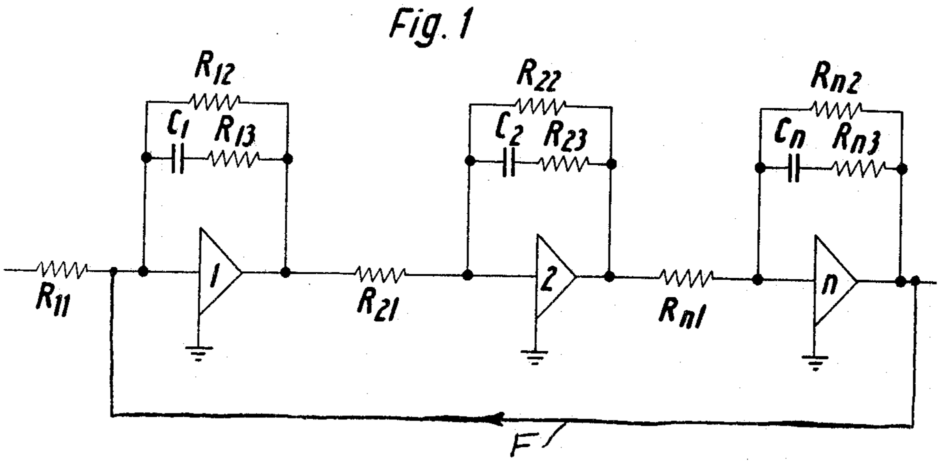

My invention relates to a multistage amplifier. More particularly, my invention relates to a multistage amplifier which prevents self-oscillations by utilizing a feedback circuit for each of its amplifier stages.

In designing a multistage amplifier having a feedback circuit connected between the output and the input of the amplifier, special attention must be paid to the frequency response of the loop amplification. Ideal feedback, and therefore ideal amplification, is provided when the feedback voltage is opposite in phase to the input voltage. Such ideal amplification occurs only in the area of the center of the frequency band to be transmitted. At the ends of the band, at the lower and higher frequencies, the loop amplification decreases due to factors caused primarily by the amplifier elements or by the coupling between the amplifier stages. The usual amplifier elements, such as electron tubes or transistors, do not decrease in frequency at the lower frequencies. Thus, the coupling between the different amplifier stages may be provided with facility and simplicity in the lower frequency direction. The frequency response of the amplifier at the higher frequencies, however, presents a considerable stability problem. In a textbook entitled "Network Analysis and Feedback Amplifier Design" by Bode, D. Van Nostrand & Company, New York, N.Y., 1945, it is taught that the frequency response of the loop amplification must have a specific configuration in order to prevent self-oscillations of the amplifier.

Various proposals have been made to provide the required configuration of the frequency response characteristic of the loop amplification in order to prevent self-oscillations of a multistage amplifier and thereby provide the necessary stability of operation of such amplifier. More specifically, the decrease in the amplification per the amplification v. frequency characteristic curve at higher frequencies is provided in a specific configuration in accordance with such proposals. Of these proposals, Brockelsby, in "Wireless Engineer," February 1949, page 43, and Mayer in "Wireless Engineer," September 1949, page 297, suggest that in an $n$ stage multistage amplifier, $n-1$ of the stages be wideband stages equal in amplification and one stage be of a narrower band than the others. Brockelsby and Mayer further suggest that the one stage of narrower band have an amplification characteristic having the configuration required for the loop amplification. In many cases, the one stage has a so-called integral behavior. This means that within the range of the integral amplification decrease the phase varies by 90° and the actual portion of the amplification decreases at the rate of 6 db per octave. If the total amplification v. frequency characteristic of the multistage amplifier without feedback requires a decrease in amplification over a large frequency range such as, for example, several octaves, on a double logarithmic scale, such a decrease would have to be provided by the one amplifier stage of narrower bandwidth.

There are several disadvantages in the system proposed by Brockelsby and Mayer wherein $n-1$ amplifier stages are wideband amplifiers and one stage is a narrower band amplifier. Among these disadvantages is the necessity for the one amplifier stage of narrower band to provide the frequency response required by the total amplification characteristic of the amplifier without feedback. Since the frequency response must frequently have the configuration of an integral or continuously extending decrease in amplification over a wide frequency range of, for example, several octaves, the one amplifier stage is subjected to extremely demanding requirements. The distributed reactances of the electrically conductive leads and the frequency response of the amplifier elements such as the electron tubes or transistors, due to the higher or upper frequencies, make practical realization of the one amplifier stage extremely difficult. Furthermore, extremely demanding requirements are imposed upon the linearity of the so-called proportional portion of the amplification v. frequency characteristic curve or frequency response of the $n-1$ wideband amplifier stages over the entire useful frequency range. These requirements can be met only by very strong internal linear feedback and necessitate a loss of amplification in the amplifier stage, so that when a specific overall amplification is required, a greater number of amplifier stages are required.

The principal object of my invention is to provide a new and improved multistage amplifier.

An object of my invention is to provide a multistage amplifier which prevents self-oscillations in a new and improved manner.

An object of my invention is to provide a multistage amplifier which provides maximum possible loop amplification with the minimum possible number of amplifier stages.

An object of my invention is to provide a multistage amplifier comprising amplifier stages of simple structure.

Another object of my invention is to provide a multistage amplifier which avoids the disadvantages over known amplifiers of similar type and which functions with efficiency, effectiveness and reliability.

In accordance with the present invention, a multistage amplifier comprises a plurality of amplifier stages each having an input and an output. The input of the first of the stages is the input of the amplifier and the output of the last of the stages is the output of the amplifier. Each of the amplifier stages has a frequency-dependent feedback circuit connected between its output and its input. Each feedback circuit has components of magnitudes such that the resultant amplification v. frequency response characteristic includes a continuously extending integral portion approximating that of the amplifier without feedback, and self-oscillations of the amplifier are prevented.

An amplifier feedback circuit is connected between the output of the last of the stages and the input of the first of the stages. The components of the feedback circuit of each of the amplifier stages have magnitudes such that the resultant amplification v. frequency response characteristic includes a continuously extending integral portion which approximates that of the amplifier without feedback and which comprises a plurality of parts each corresponding to a different frequency range and each provided by a different one of the amplifier stages.

The feedback circuit of each of the amplifier stages comprises a capacitor. A first resistor is connected in series circuit with the capacitor. The series circuit is connected between the output and the input of the corresponding amplifier stage. A second resistor is connected in parallel with the series circuit connection. A coupling resistor connects the output of each of the amplifier stages to the input of the next succeeding amplifier stage. The feedback circuit of each of the amplifier stages has a time constant determined by the equation $$R_{x3}C_x=(R_{y2}+R_{y3})C_y$$

wherein the subscript $x$ and $y$ indicate different amplifier stages, the subscript 3 indicates the first resistor, the subscript 2 indicates the second resistor, R is the resistors and C is the capacitor.

The multistage amplifier of the present invention may also be applied in principle to the configuration of the decrease in amplification at lower frequencies such as, for example, at the lower end of a transmission band. Although such application is possible, the description of my invention is confined to the configuration of the decrease in amplification at higher or increasing frequencies such as, for example, at the upper end of a transmission band.

Figure 3:
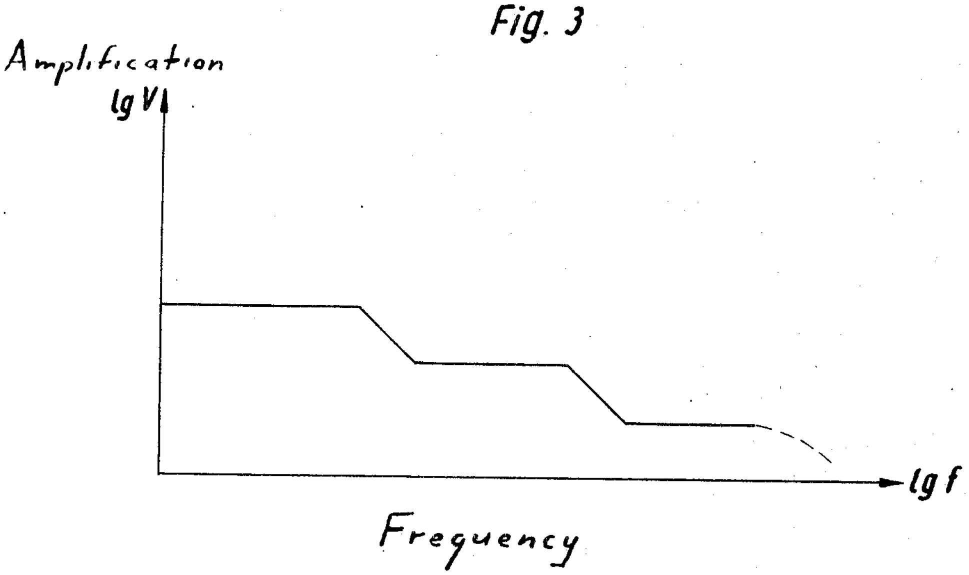
Figure 2:
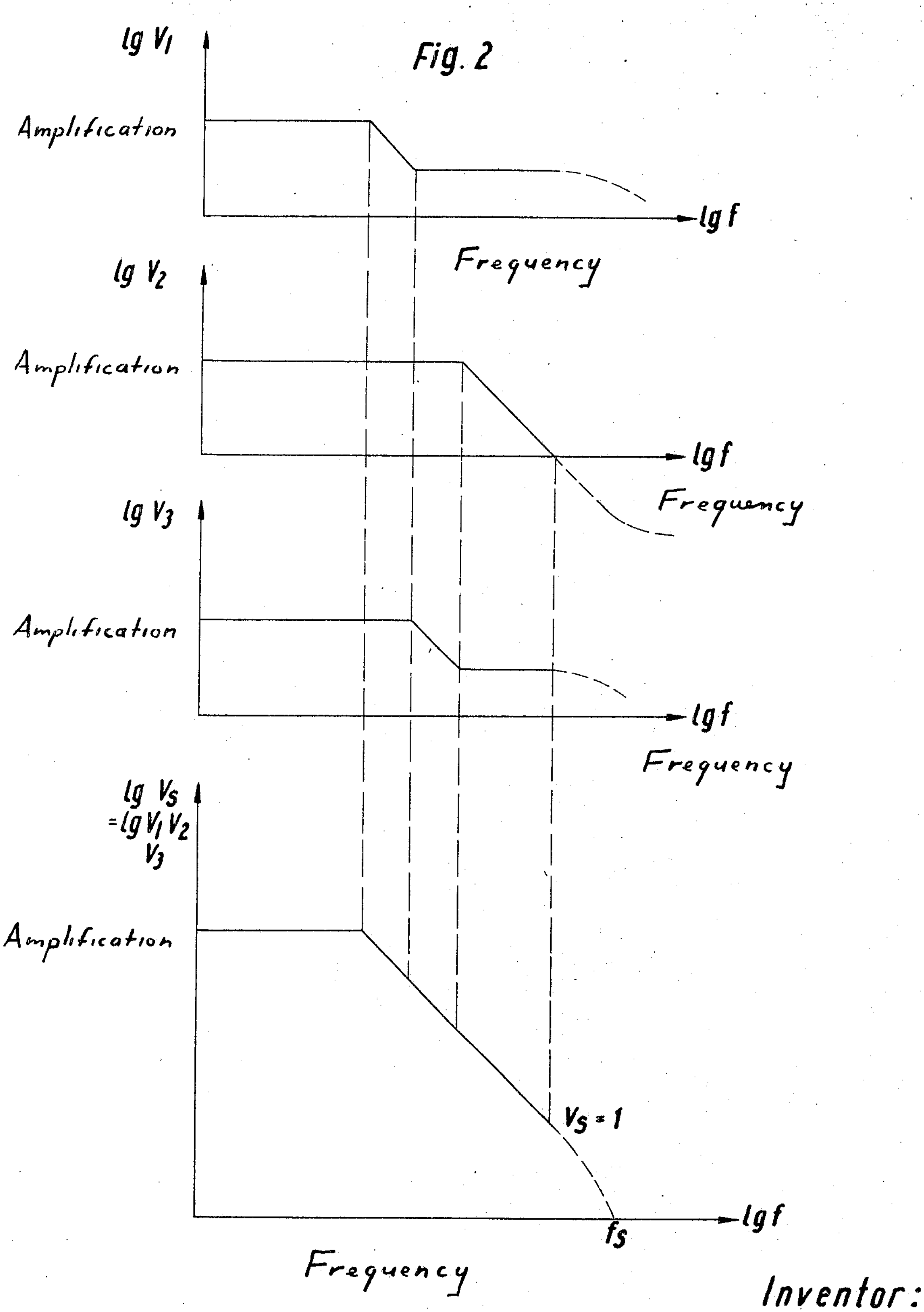

In order that the present invention may be readily carried into effect, it will now be described with reference to the accompanying drawings, wherein:

FIG. 1 is a schematic diagram of an embodiment of the multistage amplifier of the present invention;

FIG. 2 is a graphical presentation of the amplification v. frequency characteristic curve of each of the amplifier stages of the multistage amplifier of FIG. 1 and of the resultant amplification v. frequency characteristic curve of such amplifier stages which is also the amplification v. frequency response characteristic of the multistage amplifier; and FIG. 3 is a graphical presentation of another configuration of the amplification v. frequency characteristic curve of the multistage amplifier.

In FIG. 1, a multistage amplifier comprises a plurality of amplifier stages 1, 2, . . . $n$. A coupling resistor $R_{11}$ is connected to the input of the first amplifier stage 1. A coupling resistor $R_{21}$ is connected between the output of the amplifier stage 1 and the input of the next succeeding amplifier stage 2. A coupling resistor $R_{n1}$ is connected between the output of the $n-1$ amplifier stage (not shown in FIG. 1) and the input of the next succeeding amplifier stage $n$. A feedback circuit F is connected between the output of the last amplifier stage $n$ and the input of the first amplifier stage 1.

The first amplifier stage 1 has a feedback circuit comprising a capacitor $C_1$ and a first resistor $R_{13}$ connected in series circuit between the output and the input of said amplifier stage. The feedback circuit of the first amplifier stage 1 further comprises a second resistor $R_{12}$ connected in parallel with the series circuit $C_1R_{13}$. The second amplifier stage 2 has a feedback circuit comprising a capacitor $C_2$ and a first resistor $R_{23}$ connected in series circuit between the output and the input of said amplifier stage. The feedback circuit of the second amplifier stage 2 further comprises a second resistor $R_{22}$ connected in parallel with the series circuit $C_2R_{23}$. The last amplifier stage $n$ has a feedback circuit comprising a capacitor $C_n$ and a first resistor $R_{n3}$ connected in series circuit between the output and the input of said amplifier stage. The feedback circuit of the last amplifier stage $n$ further comprises a second resistor $R_{n2}$ connected in parallel with the series circuit $C_nR_{n3}$.

FIG. 2 discloses the amplification v. frequency characteristic curve for the first amplifier stage of FIG. 1 on a double logarithmic scale utilizing the Briggs logarithm in curve A. FIG. 2 discloses the amplification v. frequency characteristics curve for the second amplifier stage of FIG. 1 on a double logarithmic scale utilizing the Briggs logarithm in curve B. FIG. 2 discloses the amplification v. frequency characteristic curve for the third amplifier stage (assuming that there are only three amplifier stages in the multistage amplifier) of FIG. 1 on a double logarithmic scale utilizing the Briggs logarithm in curve C.

In curve A of FIG. 2, the abscissa represents the frequency $f$ and the ordinate represents the amplification $V_1$. The abscissa represents the frequency $f$ and the ordinate represents the amplification $V_2$ in curve B. The abscissa represents the frequency $f$ and the ordinate represents the amplification $V_3$ in curve C. Curve D of FIG. 2 discloses the resultant amplification v. frequency characteristic curve of the three amplification stages. Curve D is produced by adding the individual amplification values of each of curves A, B and C. Curve D is on a double logarithmic scale utilizing the Briggs logarithm, as are the other curves, and its abscissa represents the frequency $f$ and its ordinate represents the amplification $V_s$ which is the loop amplification of the entire amplifier and is equal to $V_1+V_2+V_3$.

In the textbook by Bode hereinbefore mentioned, it is sufficient, in illustrating the frequency response of an amplifier, to plot the sum of the amplifications of the various stages v. the frequency. The variation or rotation of the phase does not have to be illustrated. The curves of FIG. 2 are therefore ideal illustrations wherein each portion of each amplification v. frequency or frequency response characteristic which is parallel to the abscissa is identified as the proportional portion and each negative slope or linearly decreasing portion of each of said characteristics is defined as the integral portion. In each characteristic, the transition, corner or breaking frequency is the frequency at which the characteristic curve changes from its proportional portion to its integral portion. The transition frequencies are indicated by broken lines in FIG. 2. The transition frequency is generally determined by the series circuit $R_{n3}C_n$ or said series circuit and the parallel branch $R_{n2}$. The magnitude of the proportional portion of the characteristic, which is the magnitude of the amplification of the amplifier stage which is not dependent upon frequency, is determined by the ratio of the second resistor $R_{n2}$ of the amplifier stage and the input coupling resistor $R_{n1}$. The magnitude of the proportional portion is also determined by the ratio of the first and second resistors $R_{n3}$ and $R_{n2}$ of the amplifier stage and the input coupling resistor $R_{n1}$. In such case, the capacitor is considered to be short-circuited.

The loop amplification or the amplification of the multistage amplifier $V_s$, as shown in curve D of FIG. 2, which does not depend upon the frequency, is determined by multiplying all of the fractions or ratios $R_{n2}$ over $R_{n1}$ of the different amplifier stages of the multistage amplifier. Since such multiplication is illustrated on a logarithmic basis in FIG. 2, the sum of the amplification provided by each amplifier stage, $V_1$, $V_2$ and $V_3$, is the loop amplification $V_s$ of curve D. The transition frequency of the individual amplifier stages and the magnitudes of the amplification provided by the individual amplifier stages are so selected that when they are added to each other, the integral portions provide a continuously extending resultant integral portion, as shown in curve D of FIG. 2. Furthermore, as shown in the curves of FIG. 2, the amplification of each amplifier stage terminates a considerable period prior to the upper useful loop frequency $f_s$ (shown in curve D). This brings the frequency response characteristic of the frequency-dependent feedback circuit very close to the frequency response characteristic of the amplifier without feedback. The available amplifier stage amplification is thus utilized to a maximum. In the second amplifier stage 2, as shown in curve B, the integral portion extends to the useful frequency $f_s$ of the loop. This is accomplished by setting the resistor $R_{23}$ (FIG. 1) to zero. This is done in order to provide the amplification v. frequency characteristic of the multistage amplifier with an ideal integral portion which extends to the loop amplification $V_s=1$ at the frequency $f_s$. The transition frequency of the resultant amplification v. frequency characteristic or of the amplification v. frequency characteristic of the entire multistage amplifier, is determined by the lowest transition frequency of the individual amplification stages. In the present illustration, the resultant transition frequency is determined by simple calculation to be $$\frac{1}{2}\pi(R_{12}+R_{13})C_1$$

FIG. 3 illustrates another configuration for the frequency response curve of an amplifier. In FIG. 3, as in FIG. 2, the abscissa represents the frequency $f$ and the ordinate represents the amplification V. The transition or corner frequencies of the individual amplifier stages may, under certain circumstances, be considerably removed from those attained in the aforedescribed system. The resistance capacitance or RC components of the feedback circuit of one amplifier stage may thus be connected in parallel with one or more additional RC components in order to provide a stepped amplification v. frequency characteristic curve for such amplifier stage. The stepped characteristic decreases in amplitude as it approaches the higher frequencies. The transition frequencies are thus closer together in occurrence and the resultant frequency-dependent feedback provides a frequency response which closely approximates the natural frequency response of the amplifier stage or the frequency response of the amplifier stage without feedback. This provides even better utilization of the amplification of the various amplifier stages.

The multistage amplifier of the present invention permits maximum utilization of the available amplification for the amplification provided by the entire amplifier, due to the very close approximation of the frequency response characteristic to the natural frequency response of the various amplifier stages, as herebefore indicated. This permits the utilization of fewer amplifier stages while providing the same overall or loop amplification which is provided by the Bode system. Another advantage of the present invention over the Bode system is that no single amplifier stage has the burden of providing the resultant integral portion of the amplification v. frequency characteristic curve or frequency response over wide frequency ranges. In accordance with the system of the present invention, in which the continuously extending integral portion is composed of a plurality of parts each corresponding to a different frequency range and each provided by a different one of the amplifier stages, the resultant integral portion is considerably closer to the ideal integral portion than the integral portion provided by a known system. Furthermore, the individual amplifier stages of the multistage amplifier of the present invention are not subjected to the stringent requirements for linearity over a wide frequency range that the $n-1$ stages of the Bode system are subjected to. The distributed circuit reactances in the system of the present invention thus do not require the attention which must be shown those of the known systems and the production of the amplifying elements of the individual amplifier stages may thus be considerably simplified.

While the invention has been described by means of a specific example and in a specific embodiment, I do not wish to be limited thereto, for obvious modifications will occur to those skilled in the art without departing from the spirit and scope of the invention.

I claim:

1. A multistage amplifier comprising a plurality of amplifier stages each having an input and an output, the input of the first of said stages being the input of said amplifier and the output of the last of said stages being the output of said amplifier, each of said amplifier stages having a frequency-dependent feedback circuit connected between its output and its input and having components of magnitudes such that the resultant amplification v. frequency response characteristic includes a continuously extending integral portion which approximates that of said amplifier without feedback and which comprises a plurality of parts each corresponding to a different frequency range and each provided by a different one of said amplifier stages and self-oscillations of said amplifier are prevented; an amplifier feedback circuit connected between the output of the last of said stages and the input of the first of said stages; and a coupling resistor connecting the output of each of said amplifier stages to the input of the next succeeding amplifier stage, the feedback circuit of each of said amplifier stages comprising a capacitor, a first resistor connected in series circuit with said capacitor, said series circuit being connected between the output and the input of the corresponding amplifier stage, and a second resistor connected in parallel with said series circuit connection.

2. A multistage amplifier as claimed in claim 1, wherein the feedback circuit of each of said amplifier stages has a time constant determined by the equation $$R_{x3}C_x=(R_{y2}+R_{y3})C_y$$

wherein the subscripts $x$ and $y$ indicate different amplifier stages, the subscript 3 indicates said first resistor, the subscript 2 indicates said second resistor, R is said resistors and C is said capacitor.

References Cited

UNITED STATES PATENTS

| | | | |
|---|---|---|---|
| 3,209,164 | 9/1965 | DeWitt | 330—266 XR |
| 3,383,616 | 5/1968 | Friend et al. | 330—109 X |
| 3,383,610 | 5/1968 | Kedson | 330—27 X |

FOREIGN PATENTS

| | | |
|---|---|---|
| 856,157 | 3/1940 | France. |

OTHER REFERENCES

"Variable Filter Tunes to 1 Megahertz," Electronics, p. 145, July 11, 1966.

ROY LAKE, Primary Examiner

J. B. MULLINS, Assistant Examiner

U.S. Cl. X.R.

330—100, 109